(12) United States Patent
Dean et al.

(10) Patent No.: US 6,636,995 B1
(45) Date of Patent: Oct. 21, 2003

(54) METHOD OF AUTOMATIC LATCH INSERTION FOR TESTING APPLICATION SPECIFIC INTEGRATED CIRCUITS

(75) Inventors: Alvar A. Dean, Essex Junction, VT (US); Joseph A. Iadanza, Hinesburg, VT (US); David E. Lackey, Jericho, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 627 days.

(21) Appl. No.: 09/615,146

(22) Filed: Jul. 13, 2000

(51) Int. Cl.[7] .................. G01R 31/28; G06F 17/50; H03K 17/693
(52) U.S. Cl. .................. 714/724; 714/741; 716/15
(58) Field of Search .................. 714/724, 738, 714/741, 742, 799, 811; 716/13, 14, 15, 23, 24, 25

(56) References Cited

U.S. PATENT DOCUMENTS

| | | | |
|---|---|---|---|
| 4,509,116 A | 4/1985 | Lackey et al. | 364/200 |
| 4,654,785 A | 3/1987 | Nishiyama et al. | 364/200 |
| 4,683,547 A | 7/1987 | DeGroot | 364/748 |
| 5,023,875 A | 6/1991 | Lee et al. | 714/736 |
| 5,070,475 A | 12/1991 | Normoyle et al. | 395/375 |
| 5,187,712 A | 2/1993 | Malleo-Roach et al. | 714/724 |
| 5,502,731 A | 3/1996 | Meltzer | 714/726 |
| 5,544,173 A | 8/1996 | Meltzer | 714/726 |
| 5,617,430 A | 4/1997 | Angelotti et al. | 714/726 |
| 5,661,733 A | 8/1997 | Schoessow | 714/726 |
| 5,684,808 A * | 11/1997 | Valind | 714/726 |
| 5,719,879 A | 2/1998 | Gillis et al. | 714/726 |
| 5,748,647 A | 5/1998 | Bhattacharya et al. | 714/726 |
| 5,799,170 A * | 8/1998 | Drumm et al. | 716/2 |
| 5,828,673 A * | 10/1998 | Mikawa et al. | 714/718 |
| 6,070,258 A * | 5/2000 | Asaka | 714/724 |

FOREIGN PATENT DOCUMENTS

| | | |
|---|---|---|
| JP | 62094023 A | 4/1987 |
| JP | 1196159 A | 8/1989 |
| JP | 4271437 A | 9/1992 |
| JP | 9089993 A | 4/1997 |
| JP | 11052024 A | 2/1999 |

* cited by examiner

*Primary Examiner*—Christine T. Tu
(74) *Attorney, Agent, or Firm*—DeLio & Peterson LLC; Robert Curcio; Robert A. Walsh

(57) ABSTRACT

A method of testing a digital logic circuit comprises first providing a logic circuit having a plurality of interconnected circuits each having an input and an output; determining a gate level representation of the logic circuit including test nets for determining faults in the circuit; and identifying a portion of the nets which are most difficult to test, including nets which are most difficult to control and nets which are most difficult to observe. The method then includes inserting into the logic circuit control latches for nets which are determined to be most difficult to control and inserting into the logic circuit observation latches for nets which are determined to be most difficult to observe. Using the inserted control latches and observation latches, the method further includes testing the nets which are determined to be most difficult to control and nets which are hardest to observe and determining faults in the circuit. As a result of the method of the present invention, testing is completed in a time faster than if the nets were tested without the control latches and the observation latches. The portion of the nets which are most difficult to test are preferably identified by overall test time impact, and the nets having longest test times are determined to be most difficult to control and most difficult to observe.

18 Claims, 6 Drawing Sheets

Fig 3
TEST-TIME-REDUCTION LATCH INSERTION
3a) ORIGINAL NETWORK
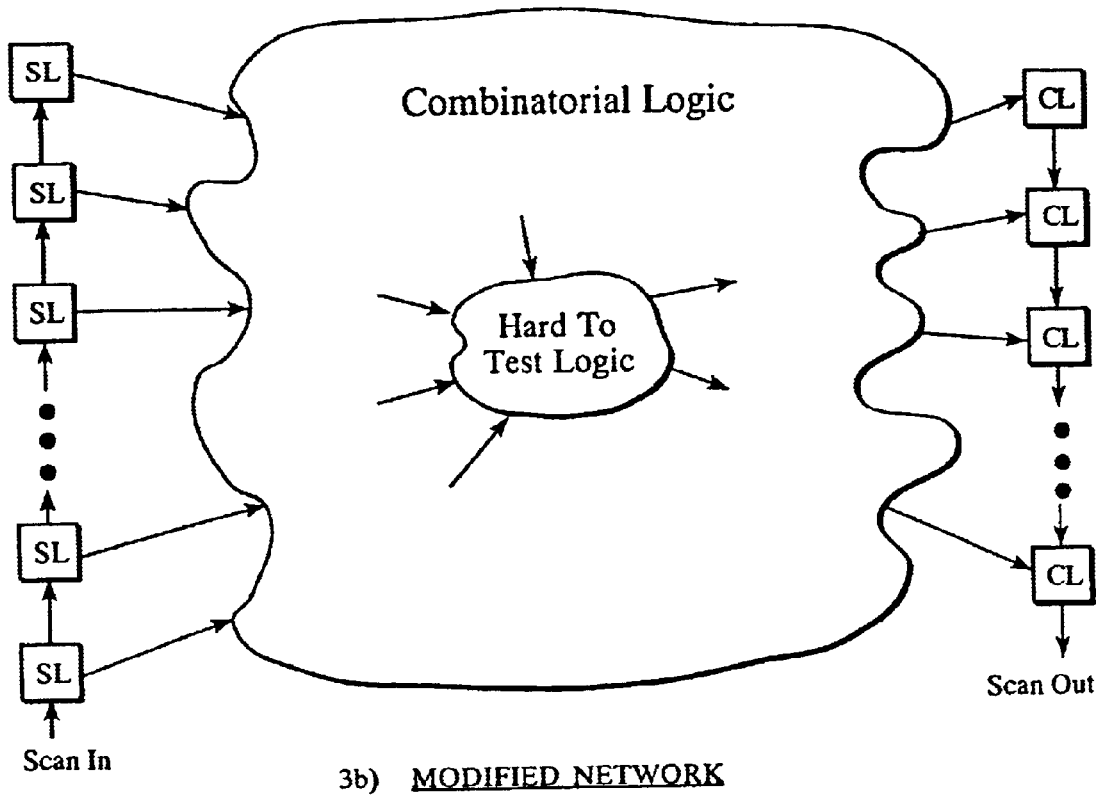
3b) MODIFIED NETWORK
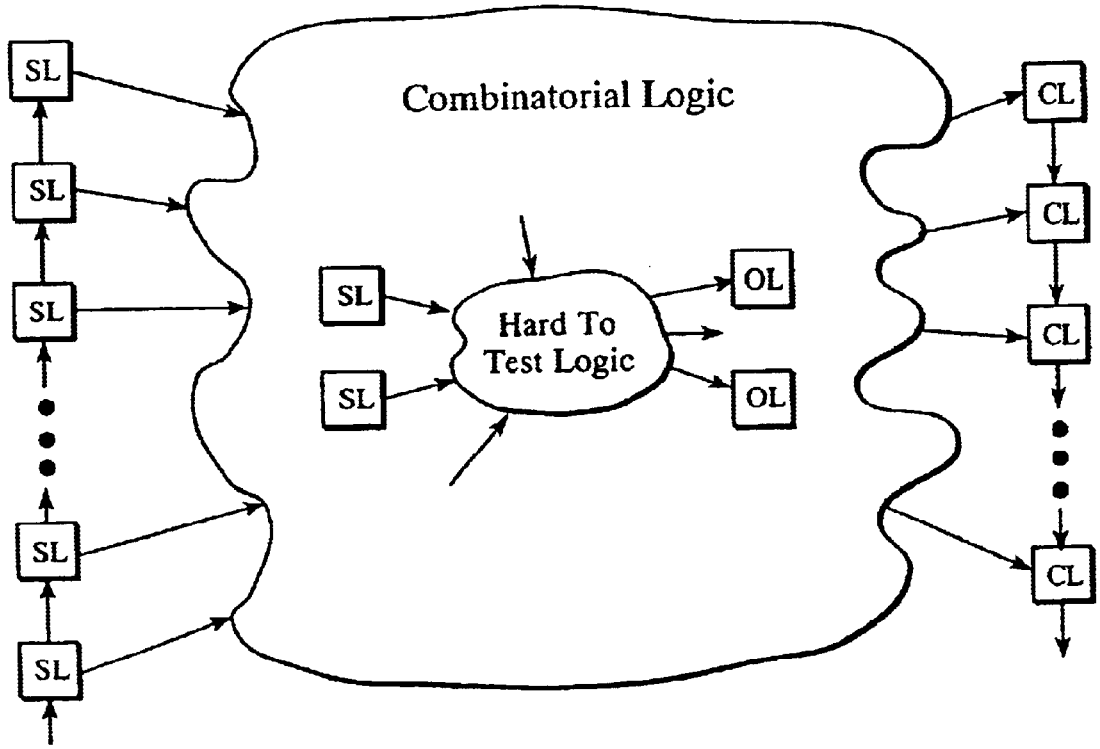

METHOD OF AUTOMATIC LATCH INSERTION FOR TESTING APPLICATION SPECIFIC INTEGRATED CIRCUITS

BACKGROUND OF THE INVENTION

1. Field of the Invention

The present invention relates to the testing of logic circuits in integrated circuit devices and, in particular, to a method of automatic latch insertion for testing application specific integrated circuits (ASICs).

2. Description of Related Art

As application specific integrated circuit (ASIC) designs grow in complexity, the overhead for manufacturing testing grows as a result of the larger test pattern set required for complete 100% test coverage. Test pattern coverage to the 100% level requires a large test time because of the number of test patterns required. In prior designs, test coverage analysis has been limited to modification of the design manually to bring coverage up to near 100%. No automated process exists which looks at a part that has achieved a test coverage goal, to optimize the pattern set length to reduce test time, while simultaneously maintaining the design's objectives for circuit area and logic performance.

Prior art in this area includes U.S. Pat. Nos. 5,502,731; 5,544,173; 5,661,733; 5,719,878 and 5,748,647, and JP01-196159A.

There exist tools in the industry that are capable of determining and even inserting control and observe test point in a netlist. However, these solutions are an additional, often iterative step in the design process. In such solutions, the test points are assessed and inserted. The design must then be assessed for new area, timing, and other design objectives in the tools that have these capacities, such as synthesis, timing analysis, and the like. Test points that violate the design criteria must then be removed from the list, and the insertion process repeated. This entire sequence is then reiterated until a set of test points are inserted that satisfy the timing, area and other criteria. A flow diagram depicting this prior art testing method is shown in FIG. 1. As a result, a general problem exists as to how to minimize test, design costs and overhead for integrated ASIC subsystems.

Although the shrinking dimensions of integrated circuits are lowering the costs of the silicon manufacture on a per die basis, the test costs are not being similarly reduced. Test times for ASIC subsystems are actually growing, causing manufacturing test to become a larger portion of the cost of the completed ASIC. There is a need for reducing test times, without impacting the design constraints of performance and area, while maintaining complete test coverage. Additionally, any such solution needs to be extendible such that it does not impact the added design constraints in effectively utilizing the performance and density advantages of shrinking process geometries and improved interconnect processes. Such constraints include interconnect parasitics and wire congestion. Finally, the solution cannot impact the ASIC development schedule. Design methods to maintain complete test coverage must be fully integrated with the design of the ASIC's function.

Bearing in mind the problems and deficiencies of the prior art, it is therefore an object of the present invention to provide an improved method of testing ASICs.

It is another object of the present invention to provide a method of testing ASICs which reduces test times, without impacting the design constraints of performance and area, and maintaining complete test coverage.

A further object of the invention is to provide a method of testing ASICs which does not impact any added design constraints.

It is yet another object of the present invention to provide a method of testing ASICs which maintain complete test coverage while being fully integrated with the design of the ASIC's function.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of testing a digital logic circuit comprising first a logic circuit having a plurality of interconnected circuits each having an input and an output; determining a gate level representation of the logic circuit including test nets for determining faults in the circuit; and identifying a portion of the nets which are most difficult to test, including nets which are most difficult to control and nets which are most difficult to observe. The method then includes inserting into the logic circuit control latches for nets which are determined to be most difficult to control and inserting into the logic circuit observation latches for nets which are determined to be most difficult to observe. Using the inserted control latches and observation latches, the method further includes testing the nets which are determined to be most difficult to control and nets which are hardest to observe and determining faults in the circuit. As a result of the method of the present invention, testing is completed in a time faster than if the nets were tested without the control latches and the observation latches. The portion of the nets which are most difficult to test are preferably identified by overall test time impact, and the nets having longest test times are determined to be most difficult to control and most difficult to observe.

In one embodiment of the present invention, the method includes tracing the logic network of the logic circuit and determining for each net a score of: i) distance in logic levels from a source latch; ii) distance in logic levels from a destination latch; iii) logic cone size that generates the net; and iv) number of latches fed by the cone driven by the net. The control and observation latches are then inserted for those nets which have qualitative scores which differ most from predetermined scores.

In another embodiment of the present invention, the method includes using a test diagnosis tool to determine test patterns, determining faults covered by each test pattern, and for each net the number of vectors needed before the net was tested. The control and observation latches are then inserted for those nets which are either determined to be not testable or which have the most vectors applied before the net was tested.

In another embodiment of the present invention, the method includes, prior to inserting the observation latches into the logic circuit, the logic cone that generates the nets is broken into at least two pieces and the observation latches and/or control latches are inserted. The method then includes, for each piece of the logic cone, calculating new design area and new timing slack for logic paths having the inserted control latches and observation latches. If the new design area and new timing slack for logic paths having the inserted control latches and observation latches violate predetermined limits, the inserted control latches are removed from the logic circuit, leaving only observation latches.

Testing of the nets preferably includes calculating new design area and new timing slack for logic paths having the inserted control latches and observation latches. The inserted control latches and observation latches remain in the logic circuit if the new design area and new timing slack for logic paths having the inserted control latches and observation latches do not violate predetermined limits. The inserted control latches and observation latches are removed from the logic circuit if the new design area and new timing slack for logic paths having the inserted control latches and observation latches violate predetermined limits.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 3 is a schematic rendering comparing a typical logic network from a test perspective with the same logic network from the perspective of the method of the present invention.

DESCRIPTION OF THE PREFERRED EMBODIMENTS

Figure 1:
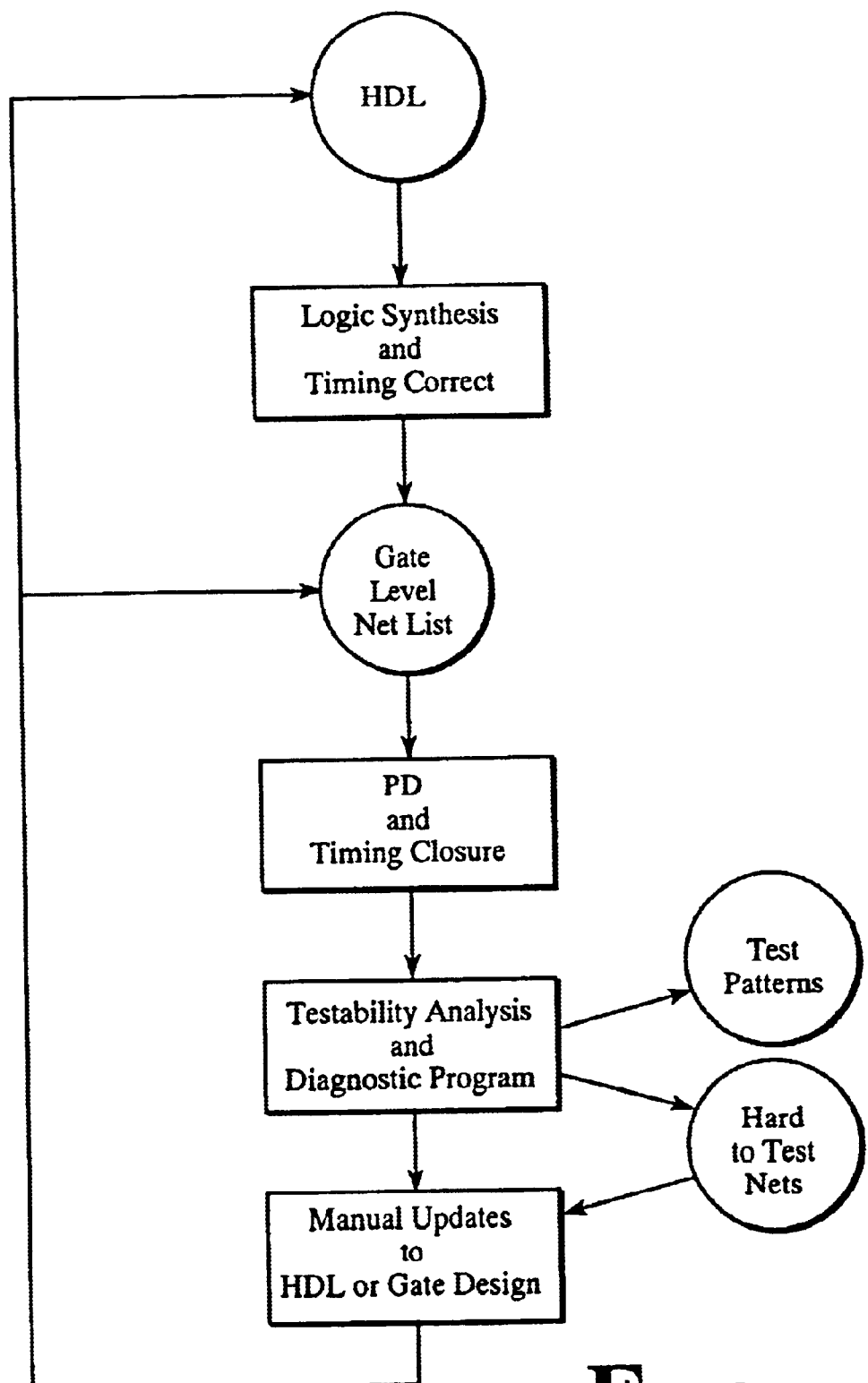
FIG. 1 is a flow diagram depicting a prior art test method for testing ASICs.

In describing the preferred embodiments of the present invention, reference will be made herein to FIGS. 2–6 of the drawings in which like numerals refer to like features of the invention. Features of the invention are not necessarily shown to scale in the drawings.

The present invention employs both Stim Latches (SL) and Observe Latches (OL). As used herein, stim latches are controlled so as to be transparent to the functional netlist, but can perform both an observation function prior to the insert point and stim functions to nodes beyond the observe point. As also used herein, observe elements or latches provide only an observation function to nodes prior to the insertion point.

Figure 2:
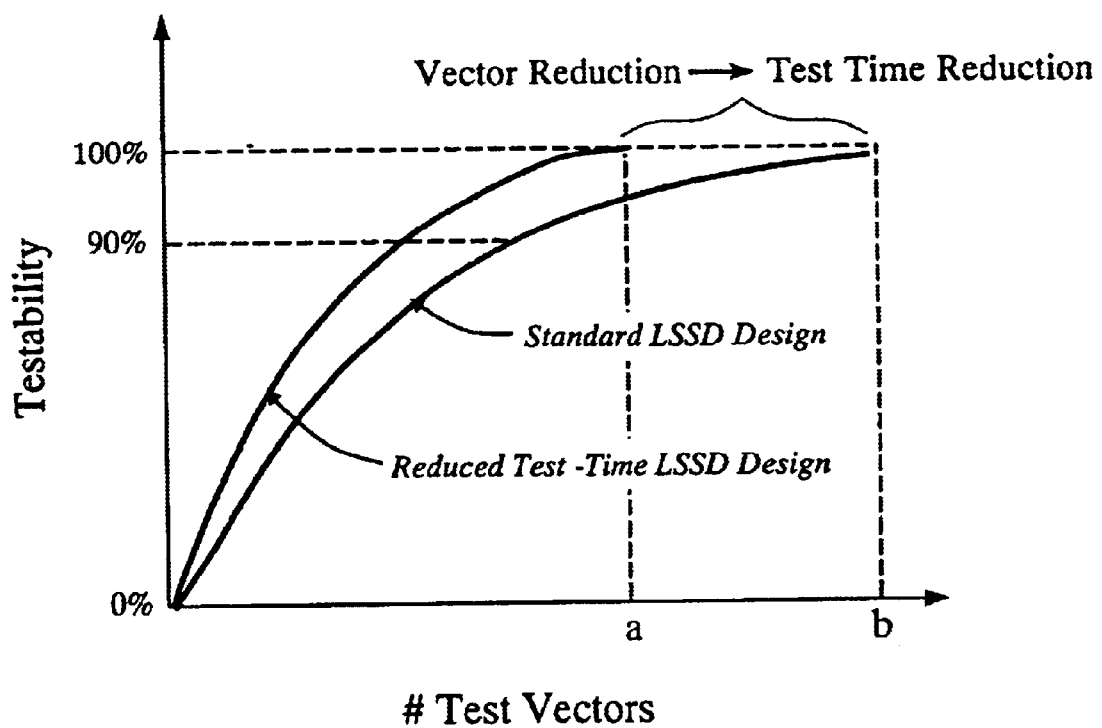
FIG. 2 is a graphical representation comparing the time for test coverage using the prior art method and the time for test coverage using the method of the present invention.

FIG. 2 is a graph comparing a typical asymptotic test coverage curve of the prior art (Standard LSSD Design) with that of the present invention (Reduced Test-Time LSSD Design). The former, prior art curve shows that a high test coverage is usually obtained with a relatively small number of test vectors, while the remaining marginal test coverage is obtained at the cost of a large number of test vectors. This phenomenon is due to the nature of logic design and logic cone structure which causes complex or deep cones of logic to be found to be hard or most difficult to test, thus requiring a large number of vectors to cover the hard or difficult-to-test logic.

The test time of the present invention is shown in the Reduced Test-Time LSSD Design curve which is shifted to the left, compared to the prior art curve, such that a larger test coverage is obtained with a smaller set of test vectors. The overall reduction of test vectors to ensure 100% test coverage results in a direct test time reduction, and thus a cost savings. This invention achieves the improvement in overall test time by automatic latch insertion via reduced test pattern sets.

As depicted in FIG. 3a, a typical logic network, from a test perspective, has combinatorial logic fed by Stim Latches (SL) and captured by Capture Latches (CL). On large cones of logic, there is typically some logic which becomes hard to test due to a lack of direct controllability of internal nodes of the cone. This logic can be tested by applying a large number of test vectors which one-by-one isolate one of these "hard to test" nodes. In some cases, the logic cone is such that a test pattern cannot be created which exercises a fault due to redundancy in the logic, or conditions which block the fault from propagating to a Capture Latch.

The approach of the present invention in reducing the number of test vectors is shown in FIG. 3b. The present invention identifies the hard to test logic and inserts specific Stim Latches to allow for better control of the state of the network and adds Observation Latches (OL) at key points in the logic to ease observation of the test faults. The present invention assumes that it is testing a testable network, and reduces the test time by making the design easier to test. The present invention in its preferred embodiment is automatic, is fully integrated into an existing design process, and whose impact to the design is maintained within the design's constraints.

Figure 4:
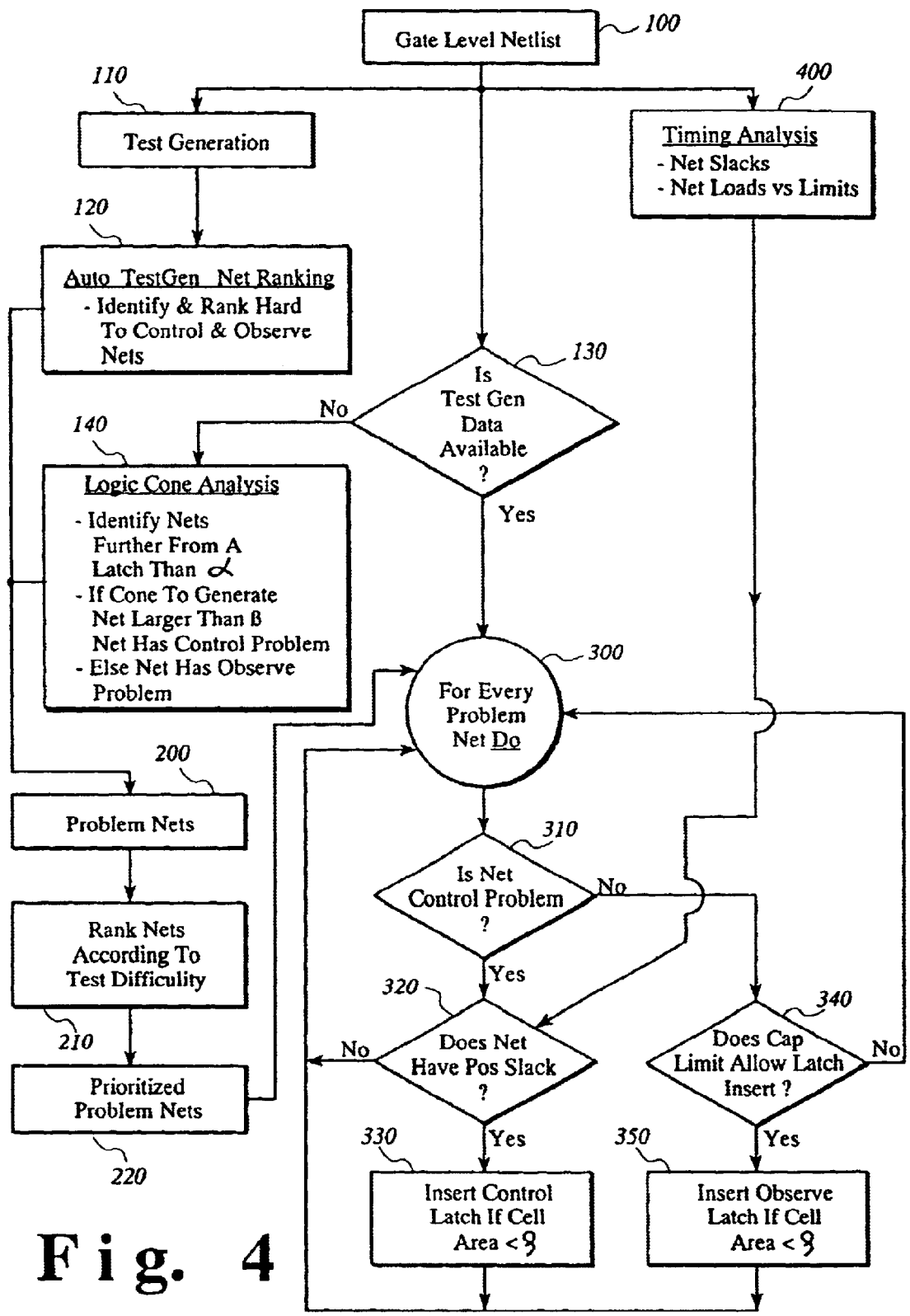
FIG. 4 is a flow diagram depicting the automatic latch selection and insertion process of the present invention.

FIG. 4 depicts the automatic process of latch selection and insertion for test time reduction in accordance with the present invention. The steps shown in the flow diagram can be executed within the scripting capabilities of a logic synthesis system incorporating area calculation and timing calculation capabilities, as well as netlist modification capabilities, once the synthesis system has determined the gate level representation of the design. The gate level representation of the design is initially determined by taking the function which is desired of the design of the logic circuit to be tested and mapping it into logic gates. This may be done with any suitable prior art system such as a synthesis tool or partial synthesis and partial direct gate implementation. As part of this, the gate level representation creates test nets to determine, i.e., exercise and observe, faults in the logic circuit. This includes placing the right value on a particular node in order to observe whether a fault has occurred there. The portions of the nets which are hardest to test are determined by overall test time impact. The nets having the longest test time are determined to be most difficult to control and most difficult to observe. Control or Stim Latches (SL) are inserted into those nets which are determined to be most difficult to control, and observation or Observe Latches (OL) are inserted into those nets determined to be most difficult to observe.

In order to determine the optimal location for insertion of the Stim Latches and Observe Latches, one of two processes may be utilized, as described below.

Ranked List

Figure 5:
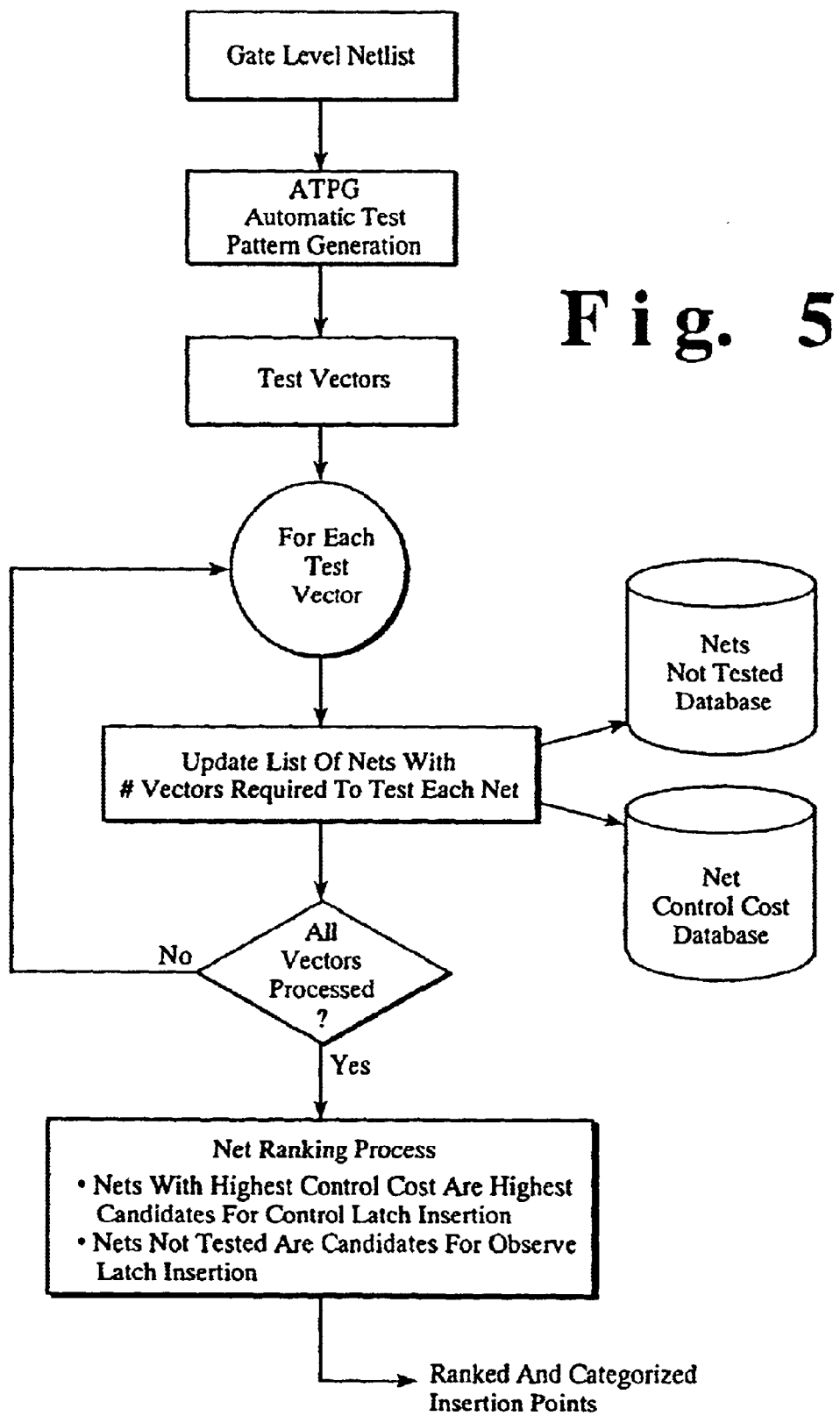
FIG. 5 is a flow diagram depicting one embodiment of determining optimal location for insertion of Stim or Observe Latches in accordance with the present invention.

One process is by generating a Ranked List, as described in FIGS. 4 and 5, which information may be read into the synthesis system as a list. This process involves ranking nets according to type and amount of test difficulty using an automated test generation method 110. A test diagnosis tool, such as IBM Test Bench available from International Business Machines Corporation, is used to generate a set of test patterns for each fault. After the standard test pattern generation is performed to gather the full set of faults in the circuit, the test vectors are saved and used to gather statistics about net coverage by test pattern. The test diagnostic tool is used to determine which faults are covered by each test pattern. For each net in the design, a field in a database is kept of the number of patterns or vectors needed before the net was tested, and problem nets are identified 200. Once all patterns or vectors have been applied, nets are either testable or not. If they are not testable, they are immediate candidates for an observation latch. The nets are then ranked 210 to according to test difficulty. If the net is testable, it will have a Net Control Cost which is a measure of how hard a net was to test, i.e., how many patterns or vectors were applied before the net was tested. This Net Control Cost is used to prioritize the problem nets 220. Observation Latch nets deemed independent due to non-overlapping cones may be OR'd together, and then fed to the Observation Latch (OL), to reduce the area and power requirements.

Logic Cone Analysis

Alternatively, if there is no test generation data available (FIG. 4, 130), the optimal location for insertion of the Stim Latches and Observe Latches may be determined by a Logic Cone Analysis algorithm 140 which can be executed or called by the script. This algorithm generates the prioritized net list by tracing and analyzing the logic cones. The prioritized list of problem nets (hard to test nets) are prioritized according to overall test time impact, such that the hardest to test nets are processed first. For every net in the prioritized problem net list, if the net has a control problem, a transparent Stim Latch (SL) is identified. Similarly, if the net has an observation problem, then an Observation Latch (OL) is identified.

The Logic Cone Analysis process consists of tracing the logic network calculating three values for every net: 1) distance in logic levels from a source latch, 2) distance in logic levels from a destination latch, 3) Logic Cone size that generates the net, and 4) number of latches fed by the cone driven by the net. The three qualitative values or scores are compared to user specified threshold qualitative values or scores. A control problem is determined for a net if any of the following thresholds are exceeded: 1) Distance in logic levels from a source latch (too large), or 3) Logic cone size that generates the net (too large). An observe problem is determined for a net if any of the following thresholds are exceeded; 2) Distance in logic levels from a destination latch (too large), or 4) Number of latches fed by the cone driven by the net (too small). Some nets may have both a control problem or an observe problem. In addition to determining what kind of potential problem a net might have, a test difficulty level is assigned for every net which is a measure of how strongly it is believed that the net will be hard to test.

In the case of hard-to-control nets, the inserted SL attempts to drive the net to a value which is the opposite of its most frequent value. If, for example, a net is normally a 0 value a vast majority of the time and a 1 a vast minority of the time because of the logic cone that drives it, the SL may be an AND or an OR statement to force the net to a more balanced value frequency, with a 0 value half the time and a 1 value half the time. The OL observes or captures the value that is on the net, whatever it is.

In its preferred embodiment, the program of the present invention runs test coverage analysis in an iterative fashion, by adding Test Improvement Latches (TILs), i.e., SLs or OLs, early in the untested fault cones, verifies the fixed fault, and determines what other untested faults now are testable. Where untested fault cones still exist, the TILs are added until the 100% test point is met.

Latch Insertion

Referring back to FIG. 4, once the Ranked List or Logic Cone Analysis is used to determine optimal location of the SLs and OLs in problem or hard-to-test nets, a determination 300 is made for every problem net whether the insertion of an individual SL or OL will excessively disrupt the logic circuit design. Design disruption is measured by the increase to total design area, i.e., the increase to total time on a path. Using the prioritized list that has been generated, the synthesis script will, beginning with the highest priority element in the list, temporarily insert the control or observation logic, SL or OL, at the desired point. If there is a net control problem 310, a SL is inserted and the new design area and the logic path's new total time, or timing slack, are calculated 320. After the total time on a path is determined, the slack measures the time left to spare. The slack is a positive number if there is time left to spare, and is a negative number if the time is exceeded and the path is failed. If there is no net control problem, a determination 340 is made whether the cap limit allows insertion of an OL. In each case, if the area threshold of the design $\zeta$ has not been exceeded, and if the required slack threshold of the path is met after the change and does not exceed or violate predetermined timing limits, then the inserted SL or OL logic will remain in the design (steps 330 and 350, respectively). Otherwise, if the inserted SL or OL logic violates the predetermined area $\zeta$ and timing limits, it will be removed and design restored to its original state, and the system of the present invention then repeats step 300 for the next problem net. If the synthesis system is also capable of determining or estimating wire congestion, logic placement, and capacitive load, these factors will also be assessed for acceptance of the logic change introduced by each element in the list.

If the list is processed against a logic circuit design for which scan has already been inserted by the synthesis system or some other process, then the synthesis script will modify the scan string to include the new latches. Similarly, if the design has already had clock powering networks inserted, then the required clock circuits will be added by the synthesis script to accommodate the new latches.

Breaking Logic Cone into Multiple Pieces

In an alternate embodiment, prior to inserting the observation latches into the logic circuit, the present invention breaks the logic cone that generates the nets into at least two or more multiple pieces and inserts into each piece of the logic circuit observation latches and/or control latches. When the synthesis process assesses area and timing, if the process of breaking the cone into multiple pieces and adding the latches fails to meet the synthesis objectives, i.e., the design's objectives for circuit area and logic performance, any previously inserted Control Latches will be removed and the synthesis will be re-tried with the observation capability (OL) only.

Figure 6:
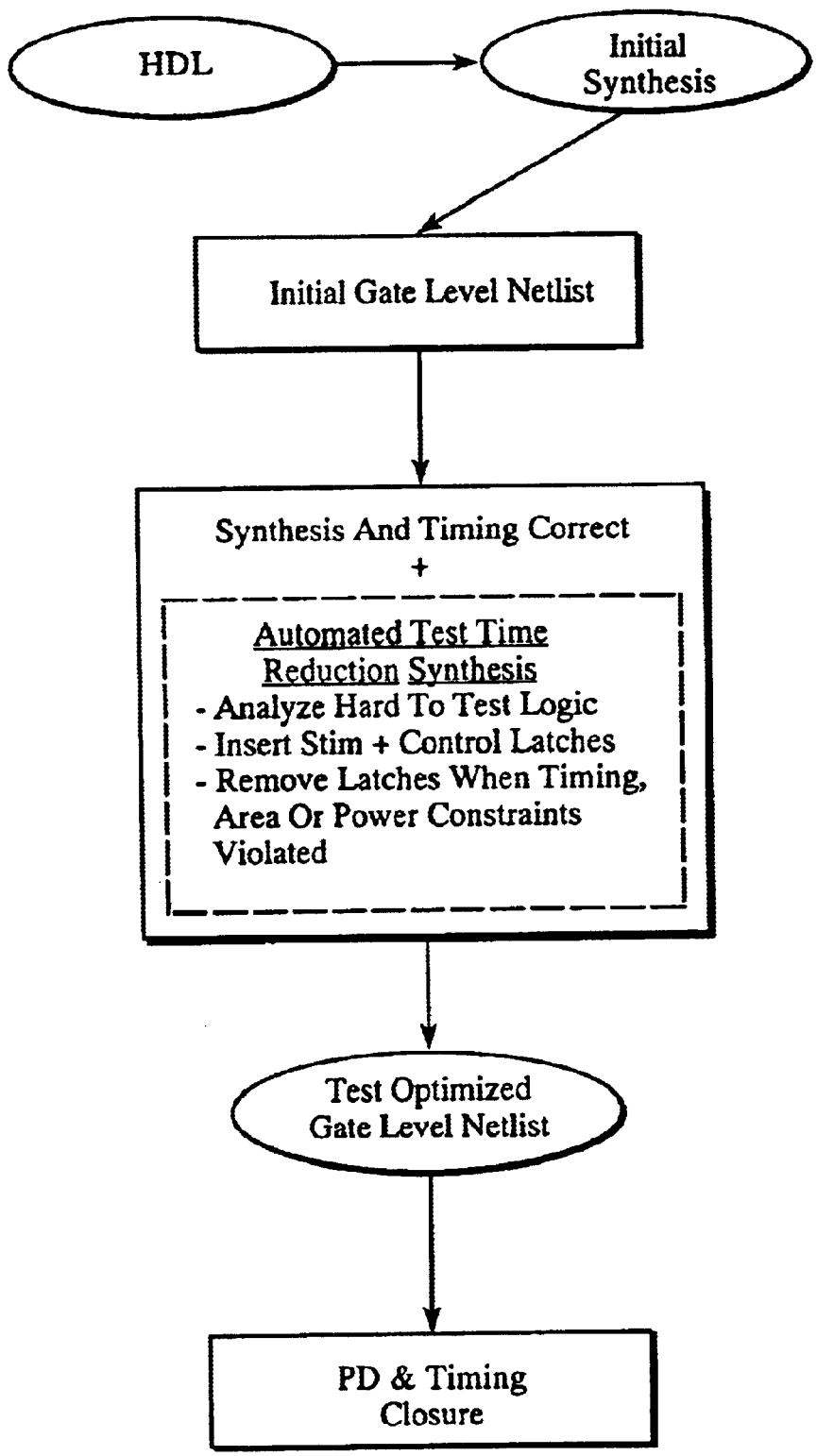
FIG. 6 is a flow diagram depicting synthesis of the inserted test points and the physical design process in accordance with the present invention.

FIG. 6 depicts in a flow diagram synthesis of the inserted test points and the physical design process in accordance with the present invention. Once the Stim and Control Latches have been determined as described above and there is an initial gate level netlist, the next step is synthesis and timing correction. The Stim and Control Latches are inserted in a synthesis process, but are removed when timing, area or power constraints in the design are violated. Subsequently, an otherwise conventional overall design process generates a test optimized gate level netlist which meets design constraints, and then PD (physical design or layout) and timing closure are determined, which embody the gate level netlist onto an integrated circuit chip.

As a result of the present invention, the use of additional latches in either an observe or transparent configuration improves the testability with fewer test patterns especially for large cones. The objects recited above are achieved in that the present invention provides an improved method of testing ASICs which looks at a part that has achieved a test coverage goal, optimizes the pattern set length to reduce test time, and simultaneously maintains the design's objectives for circuit area and logic performance.

While the present invention has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of testing a digital logic circuit comprising:
providing a logic circuit having a plurality of interconnected circuits each having an input and an output;
determining a gate level representation of the logic circuit including test nets for determining faults in the circuit;
identifying a portion of the nets which are most difficult to test, including nets which are most difficult to control and nets which are most difficult to observe;
inserting into the logic circuit control latches for nets which are determined to be most difficult to control;
inserting into the logic circuit observation latches for nets which are determined to be most difficult to observe;
using the inserted control latches and observation latches, first testing the nets which are determined to be most difficult to control and nets which are hardest to observe and determining faults in the circuit, wherein testing is completed in a time faster than if the nets were tested without the control latches and the observation latches.

2. The method of claim 1 wherein the portion of the nets which are most difficult to test are identified by overall test time impact, and the nets having longest test times are determined to be most difficult to control and most difficult to observe.

3. The method of claim 1 including tracing logic network of the logic circuit and determining for each net a score of: i) distance in logic levels from a source latch; ii) distance in logic levels from a destination latch; iii) logic cone size that generates the net; and iv) number of latches fed by the cone driven by the net, and wherein the control and observation latches are inserted for those nets which have qualitative scores which differ most from predetermined scores.

4. The method of claim 1 including using a test diagnosis tool to determine test patterns, determining faults covered by each test pattern, and for each net the number of vectors needed before the net was tested, and wherein the control and observation latches are inserted for those nets which are either determined to be not testable or which have the most vectors applied before the net was tested.

5. The method of claim 1 wherein testing of the nets includes calculating new design area and new timing slack for logic paths having the inserted control latches and observation latches.

6. The method of claim 5 wherein the inserted control latches and observation latches remain in the logic circuit if the new design area and new timing slack for logic paths having the inserted control latches and observation latches do not violate predetermined limits.

7. The method of claim 5 wherein the inserted control latches and observation latches are removed from the logic circuit if the new design area and new timing slack for logic paths having the inserted control latches and observation latches violate predetermined limits.

8. The method of claim 1 wherein, prior to inserting the observation latches into the logic circuit, the logic cone that generates the nets is broken into at least two pieces and the observation latches and/or control latches are inserted.

9. The method of claim 8 including, for each piece of the logic cone, calculating new design area and new timing slack for logic paths having the inserted control latches and observation latches.

10. The method of claim 9 wherein, if the new design area and new timing slack for logic paths having the inserted control latches and observation latches violate predetermined limits, the inserted control latches are removed from the logic circuit, leaving only observation latches.

11. A method of testing a digital logic circuit comprising:
providing a logic circuit having a plurality of interconnected circuits each having an input and an output;
determining a gate level representation of the logic circuit including test nets for determining faults in the circuit;
identifying a portion of the nets which are most difficult to test by overall test time impact, including nets having longest test times which are most difficult to control and which are most difficult to observe, and further including tracing logic network of the logic circuit and determining for each net a score of: i) distance in logic levels from a source latch; ii) distance in logic levels from a destination latch; iii) logic cone size that generates the net; and iv) number of latches fed by the cone driven by the net;
inserting into the logic circuit control latches for nets which are determined to be most difficult to control and which have qualitative scores which differ most from predetermined scores;
inserting into the logic circuit observation latches for nets which are determined to be most difficult to observe and which have qualitative scores which differ most from predetermined scores;
using the inserted control latches and observation latches, first testing the nets which are determined to be most difficult to control and nets which are hardest to observe and determining faults in the circuit, wherein testing is completed in a time faster than if the nets were tested without the control latches and the observation latches.

12. A method of testing a digital logic circuit comprising:
providing a logic circuit having a plurality of interconnected circuits each having an input and an output;
determining a gate level representation of the logic circuit including test nets for determining faults in the circuit;
identifying a portion of the nets which are most difficult to test by overall test time impact, including nets having longest test times which are most difficult to control and which are most difficult to observe, by using a test diagnosis tool to determine test patterns, determining faults covered by each test pattern, and for each net the number of vectors needed before the net was tested;
inserting into the logic circuit control latches for nets which are determined to be most difficult to control, as either determined to be not testable or which have the most vectors applied before the net was tested;
inserting into the logic circuit observation latches for nets which are determined to be most difficult to observe, as either determined to be not testable or which have the most vectors applied before the net was tested;

using the inserted control latches and observation latches, first testing the nets which are determined to be most difficult to control and nets which are hardest to observe and determining faults in the circuit, wherein testing is completed in a time faster than if the nets were tested without the control latches and the observation latches.

13. A method of testing a digital logic circuit comprising:

providing a logic circuit having a plurality of interconnected circuits each having an input and an output;

determining a gate level representation of the logic circuit including test nets for determining faults in the circuit;

identifying a portion of the nets which are most difficult to test by overall test time impact, including nets having longest test times which are most difficult to control and which are most difficult to observe;

inserting into the logic circuit control latches for nets which are determined to be most difficult to control;

breaking the logic cone that generates the nets into at least two pieces;

inserting into the logic circuit of each piece of logic cone observation latches for nets which are determined to be most difficult to observe and, optionally, control latches for nets which are determined to be most difficult to control;

using the inserted control latches and observation latches, first testing the nets which are determined to be most difficult to control and nets which are hardest to observe and determining faults in the circuit, wherein testing is completed in a time faster than if the nets were tested without the control latches and the observation latches.

14. The method of claim 13 including, for each piece of the logic cone, calculating new design area and new timing slack for logic paths having the inserted control latches and observation latches.

15. The method of claim 14 wherein, if the new design area and new timing slack for logic paths having the inserted control latches and observation latches violate predetermined limits, the inserted control latches are removed from the logic circuit, leaving only observation latches.

16. A method of testing a digital logic circuit comprising:

providing a logic circuit having a plurality of interconnected circuits each having an input and an output;

determining a gate level representation of the logic circuit including test nets for determining faults in the circuit;

identifying a portion of the nets which are most difficult to test by overall test time impact, including nets having longest test times which are most difficult to control and which are most difficult to observe;

inserting into the logic circuit control latches for nets which are determined to be most difficult to control;

inserting into the logic circuit observation latches for nets which are determined to be most difficult to observe;

using the inserted control latches and observation latches, first testing the nets which are determined to be most difficult to control and nets which are hardest to observe, including calculating new design area and new timing slack for logic paths having the inserted control latches and observation latches, and determining faults in the circuit, wherein testing is completed in a time faster than if the nets were tested without the control latches and the observation latches.

17. The method of claim 16 wherein the inserted control latches and observation latches remain in the logic circuit if the new design area and new timing slack for logic paths having the inserted control latches and observation latches do not violate predetermined limits.

18. The method of claim 16 wherein the inserted control latches and observation latches are removed from the logic circuit if the new design area and new timing slack for logic paths having the inserted control latches and observation latches violate predetermined limits.

* * * * *